United States Patent [19]

Haas et al.

[11] 4,456,996

[45] Jun. 26, 1984

[54] PARALLEL/SERIES ERROR CORRECTION CIRCUIT

[75] Inventors: Lawrence J. Haas; Arthur W. Klibbe, both of Broomfield; Pedro I. Perez-Mendez, Westminster, all of Colo.

[73] Assignee: Bell Telephone Laboratories, Incorporated, Murray Hill, N.J.

[21] Appl. No.: 326,828

[22] Filed: Dec. 2, 1981

[51] Int. Cl.³ .............................................. G06F 11/00
[52] U.S. Cl. ......................................... 371/37; 371/38
[58] Field of Search ..................... 371/37, 38, 13, 21; 364/200, 900

[56] References Cited

U.S. PATENT DOCUMENTS 4,058,851 11/1977 Scheuneman ........................ 371/38
4,319,356 3/1982 Kocol et al. ......................... 371/38
4,340,964 7/1982 Sprick et al. ........................ 371/38

OTHER PUBLICATIONS

Katsafouros et al., "Memory With Selective Use of Error Detection and Correction Circuits," IBM Tech. Disclosure Bulletin, vol. 16, No. 7A, 12/80, pp. 2866–2867.
Wolff, "Parallel I/O Error Detection and Correction," IBM Tech. Disclosure Bulletin vol. 7, No. 10, Mar. 1965, pp. 927–928.

Primary Examiner—Jerry Smith
Assistant Examiner—Michael R. Fleming
Attorney, Agent, or Firm—James M. Graziano

[57] ABSTRACT

In a data processing system, the subject error correcting circuit is connected in the bridging mode to the data bus which interconnects a processor and a memory for error detection. It is presumed that the memory words obtained from the memory are relatively error-free, and the subject circuit does not delay their transmission, but simply monitors the data. If an error in the data is detected, an error signal is generated on the next processor microcycle, the processor aborts its present operation and then fetches the corrected data from the error correction circuit. If the frequency of errors increases or if a permanent error is detected, the subject error correction circuit switches to an in-line mode where it functions much as prior art error correction circuits: delaying the transmission of each memory word until the error check is complete.

11 Claims, 4 Drawing Figures

PARALLEL/SERIES ERROR CORRECTION CIRCUIT

FIELD OF THE INVENTION

This invention relates to a system for connecting error correction circuitry on the data bus between a memory and a processor and, in particular, for connecting the error correction circuitry in either a parallel (bridged) or series mode as appropriate. Unlike prior art error correction circuitry, in which the error correction circuit (ECC) is connected only in a series mode between a memory and a processor, the subject invention connects a conventional error correction circuit in parallel mode onto the data bus between a memory and a processor for error detection. A memory error signal from the error correction circuit casues the processor to branch to an error recovery routine that takes the corrected data from the error correction circuit. For soft errors, this would be a single event, while for permanent errors the processor causes an automatic switchover to the series correcting mode.

DESCRIPTION OF THE PRIOR ART

With prior art read error correction circuitry, each time that data are read from memory, those data are passed through an error correction circuit that is connected in series between the memory and the processor. This error correction circuit verifies and corrects data before they are passed to the processor. This method of error checking and correcting adds a propagation delay to the time required to execute a memory read. Assuming a memory read operation requires a microcycle time of 320 ns. without error checking, the error checking operation of the error correction circuit adds a typical propagation delay of about 18% to each memory read operation. The problem with this arrangement is that every memory read operation suffers this propagation delay penalty even though the actual need for error correction may be infrequent.

SUMMARY OF THE INVENTION

The parallel/series error correction circuitry of this invention eliminates this propagation delay penalty from all error free data read from memory, while providing for full series error correction when a permanent error is detected. This is accomplished by the switching capability of the subject error correction circuit. When a memory read operation is executed, a memory word is placed on the processor input bus as if error free, while at the same time being checked for errors by the error correction circuit which is connected to the bus in the bridged mode. If the data contained in this memory word are error free, then no error correction is required and the propagation delay associated with prior art series error correction circuit will have been eliminated.

When an error in the data is detected by the error correction circuit, the error correction circuit generates a Memory Error (MER) signal to indicate an error in the data and sends the MER signal to the processor during the following microcycle. Since the processor has accepted the data which contains an error, the processing of this data could cause destruction of existing valid processor data. Therefore, the MER signal is used to prevent the clock from strobing the processor, the data registers, and the status registers, thereby aborting the processor operation. The processor is then forced to branch to an error recovery routine, where error correction and error status operations are performed. The error correction circuit corrects the data and latches the corrected data. The processor momentarily switches the error correction circuit into the series mode, reads the corrected data from the error correction circuit and then returns the error correction circuit to the bridged mode. If a permanent error is detected, the error correction circuit is maintained in the series mode where each data transmission is delayed.

DETAILED DESCRIPTION

Figure 1:
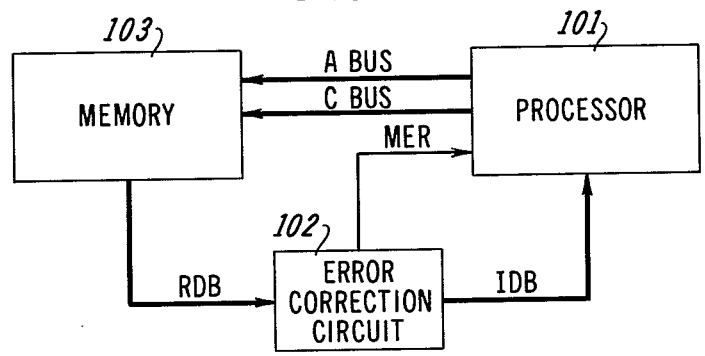
FIG. 1 illustrates, in block diagram form, the conventional circuit embodiment of a typical prior art series error correction circuit.

FIG. 1 illustrates the circuitry required to connect processor 101, error correction circuit 102, and memory 103 in the conventional prior art series error correction circuit configuration. Processor 101 addresses memory 103 to read data from the memory by passing the desired control signals and memory address from processor 101 to memory 103 on control bus CBUS and address bus ABUS, respectively. The requested memory word which includes error correcting code bits are read from memory 103 and passed to error correction circuit 102 via the Read Data Bus (RDB). Error correction circuit 102 is a conventional error checking device such as the Intel Corporation's 8206 error detection and correction unit. Error correction circuit 102 delays the transfer of data to processor 101 while it verifies the data and, if necessary, corrects data errors that are detected. If an error is detected, error correction circuit 102 not only corrects the data but also generates a Memory Error signal and applies this signal to lead MER, thereby providing processor 101 with this bit of information for error logging purposes. The verified or corrected data are then latched by error correction circuit 102 on to Input Data Bus (IDB) where they are read into processor 101.

Processor 101

Processor 101 is virtually insulated from the occurrence of faults in the data by error correction circuit 102. The only fault indication that processor 101 receives is a memory error signal on lead MER, which signal may be used by processor 101 for maintenance functions. It is helpful at this point to discuss the basic structure of processor 101.

Figure 2:
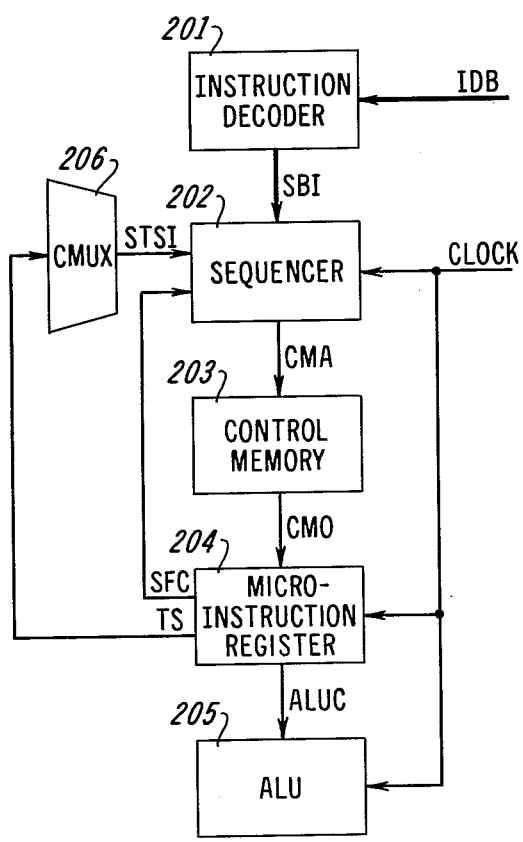
FIG. 2 illustrates, in block diagram form, the conventional processor microlevel architecture.

FIG. 2 illustrates the relevant microlevel architecture of conventional microprogrammable processor 101 which is shown in FIG. 1. Processor 101 is driven by coded instructions which, along with data, are typically stored in memory 103. These coded instructions contain opcodes that are code bits which designate a function or operation that processor 101 is to perform. These opcodes are routed by processor 101 to its instruction decoder 201 via the Input Data Bus (IDB). Instruction decoder 201 translates the received instruction opcode into the address of the microprogram entry point, which microprogram performs the function or operation designated by the opcode. The entry point address is passed to sequencer 202 via the Sequencer Branch Input (SBI) bus. Sequencer 202 uses these entry point addresses to sequence through control memory 203 via the Control Memory Address (CMA) bus. The control memory 20 outputs microinstructions that are loaded and latched every cycle in the MicroInstruction Register (MIR) 204 via the Control Memory Output (CMO) bus. These microinstructions control the function input of sequencer 202 via the Sequencer Function Control (SFC) bus, the function input of Arithmetic Logic Unit (ALU) 205 via the ALU function control (ALUC) bus, and the test select input of condition multiplexer (CMUX) 206 via the Test Select (TS) bus as well as other control functions not critical to this discussion. These units respond to these function input signals by performing the operation indicated by the microinstructions stored in microinstruction register 204. The test select signal is passed from condition multiplexer 206 to sequencer 202 via the Sequencer Test Select Input (STSI) signal lead, which signal forces sequencer 202 to perform conditional branches (when necessary) within the processor.

These above-mentioned elements are all well-known in the art and are illustrated, in block diagram form, in FIG. 2 to simply assist in the understanding of the subject invention. It is evident that there are many control, timing and data leads that are not illustrated in FIG. 2 but which are present in processor 101.

DESCRIPTION OF THE PREFERRED EMBODIMENT

Figure 3:
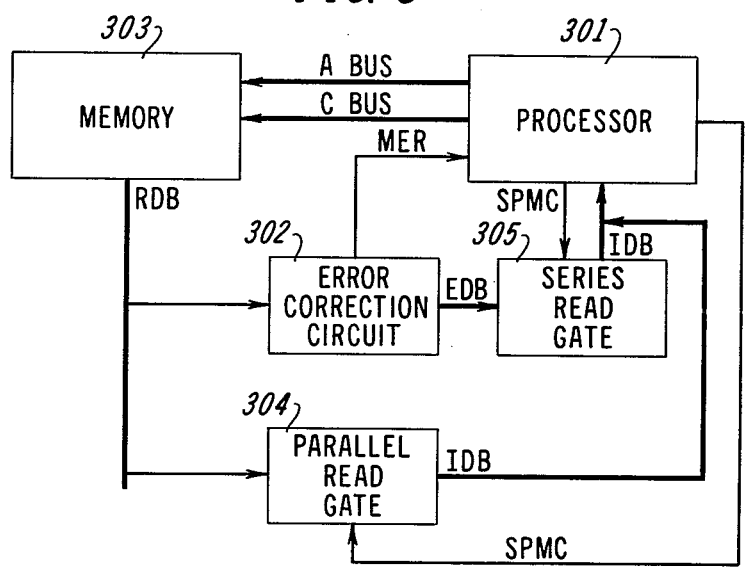
FIG. 3 illustrates, in block diagram form, an embodiment of circuitry that implements the parallel/series error correction circuit of this disclosure.

FIG. 3 shows the circuitry required to interconnect processor 301, memory 303, and error correction circuit 302 in the subject invention. When operating in the parallel error correction mode, processor 301 addresses memory 303 via control and address busses, CBUS and ABUS, respectively. The requested memory word that includes error correcting code bits is read from memory 303 and passed to error correction circuit 302 over the Read Data Bus (RDB). The requested memory word without the error correcting code bits is also passed to the parallel read gate 304 via the Read Data Bus (RDB). Error correction circuit 302 checks the memory word for errors while at the same time the data are passed through parallel read gate 304 to processor 301 via the Input Data Bus (IDB).

If data error(s) are detected, error correction circuit 302 sends a memory error signal on lead MER to processor 301, corrects the data, and latches the corrected data. Processor 301, in response to the signal on lead MER, branches to the error recovery routine and momentarily activates the Series/Parallel Mode Control (SPMC) lead to enable the corrected data to be read from error correction circuit 302 over output bus EDB through series read gate 305 into processor 301 via the Input Data Bus (IDB). Once the corrected data is read into processor 301, control lead SPMC is deactivated and the circuit resumes monitoring the data in bridged fashion.

When an error diagnostic routine in processor 301 diagnoses a permanent error condition, a Hard Error Alarm is activated. This alarm causes processor 301 to leave the Series/Parallel Mode Control (SPMC) signal lead active. The signal on lead SPMC disables parallel read gate 304 and enables the series read gate 305. The SPMC signal switches the error correction circuitry of this invention into a series error correction mode. All data read from memory 303 are now passed via the Read Data Bus (RDB) to error correction circuit 302 for correction. Error correction circuit 302 verifies, corrects and latches the data. The data are then read out of error correction circuit 302 by processor 301 via the Input Data Bus (IDB). The error correction circuitry of this embodiment remains in the series error correction mode until the cause of the permanent error has been repaired and the alarm has been reset.

Processor 301

Since the error correction circuit 302 of the subject invention is connectable in either the series or parallel (bridged) modes, processor 301 must control the circuit configuration to maximize the system efficiency. To accomplish this control function, the basic processor architecture of FIG. 2 must be expanded to that illustrated in FIG. 4.

Figure 4:
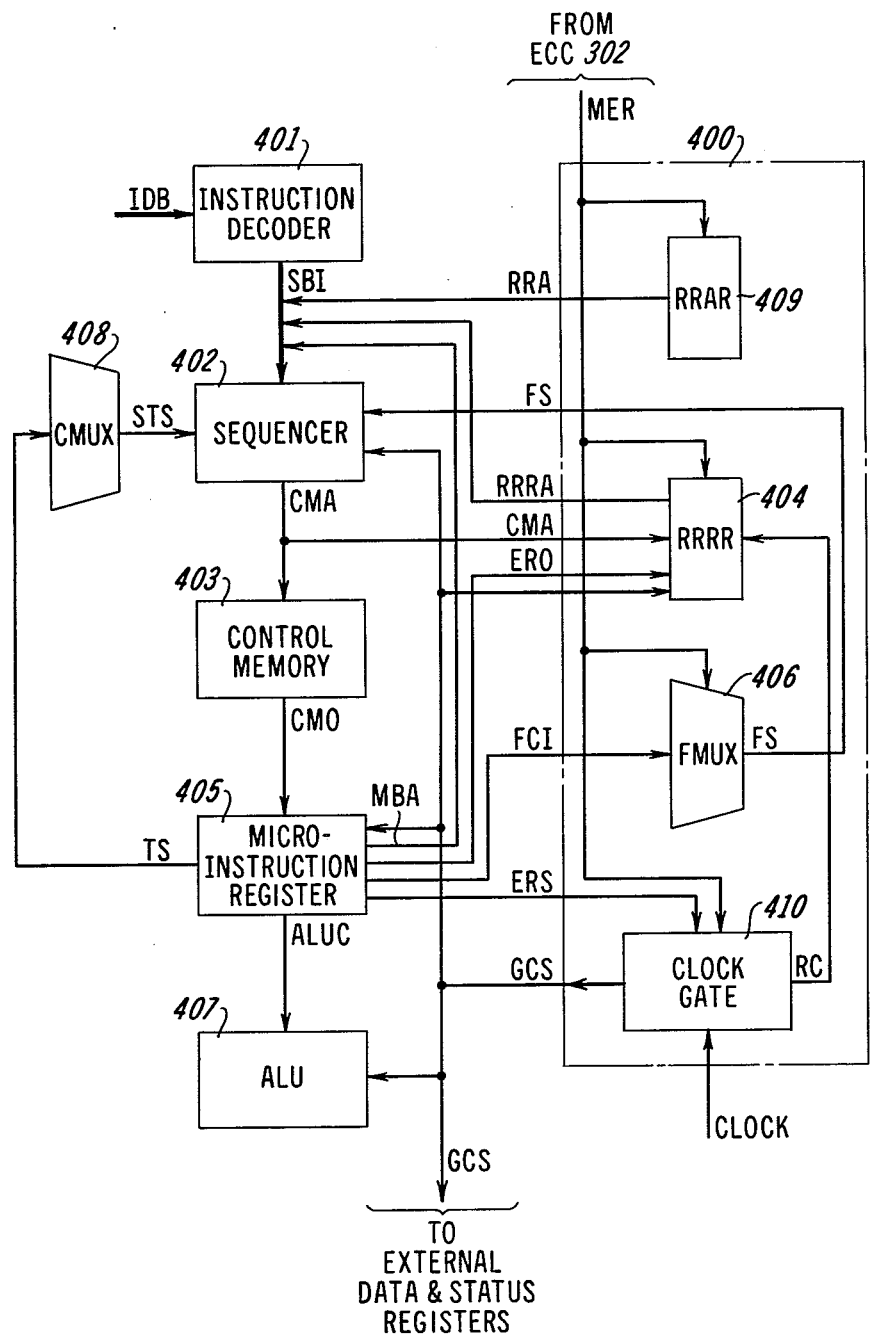
FIG. 4 illustrates, in block diagram form, an embodiment of a processor microlevel architecture that supports the parallel/series error correction circuitry of this disclosure.

FIG. 4 illustrates the relevant microlevel architecture of a microprogrammable processor 301 which is shown in FIG. 3. As with processor 101, processor 301 is driven by coded instructions which along with data are typically stored in memory 303. These coded instructions contain opcodes that are code bits which designate a function or operation which processor 301 is to perform. These opcodes are routed by processor 303 to its instruction decoder 401 via the Input Data Bus (IDB). Instruction decoder 401 translates the received instruction opcode into the address of the microprogram entry point, which microprogram performs the function or operation designated by the opcode. The entry point address is passed to sequencer 402 via Sequencer Branch Input (SBI) bus. Sequencer 402 uses these entry point addresses to sequence through control memory 403 via the control Memory Address (CMA) bus. The CMA bus is also connected to the Return from Recovery Routine Register (RRRR) 404. The output of control memory 403 are the microinstructions that are loaded and latched every cycle into microinstruction register (MIR) 405 via the Control Memory Output (CMO) bus. These microinstructions control the function input of function multiplexer (FMUX) 406 via the Function Control Input (FCI) bus, the function input of arithmetic logic unit (ALU) 407 via the ALU function control (ALUC) bus, and the test select input of condition multiplexer (CMUX) 408 via the Test Select (TS) bus. These units respond to these function input signals by performing the operation indicated by the microinstructions stored in microinstruction register 405. The Function signal is passed from function multiplexer 406 to sequencer 402 via the Function Select (FS) bus. The Test Select signal is passed from condition multiplexer 408 to sequencer 402 via the Sequencer Test Select (STS) signal lead, which signal forces sequencer 402 to perform conditional branches (when necessary) within the processor.

Recovery Routine Address Register (RRAR) 409 contains the address of the recovery microroutine address. Return from Recovery Routine Register (RRRR) 404 contains the address of the microinstruction that was aborted (the microinstruction addressed by control memory 403). Clock gate 410 requires that signal MER and the Enable Return from Routine Recovery Register Strobing (ERS) both be true in order for the Gated Clock Signal (GCS) to strobe Arithmetic Logic Unit (ALU) 407, Return from Recovery Routine Register (RRRR) 404, and the external data and status registers (not shown).

Error Recovery Operation

For explanation purposes, assume that a memory read has been executed during microcycle MC1, and that the data read contains an error. Within 100 ns. of the beginning of the following microcycle (MC2), error correction circuit 302 detects the error, latches the corrected data, and generates a memory error signal on lead MER.

The memory error signal disables clock gate 410. The Gated Clock Signal (GCS) lead is held false, and does not strobe microinstruction register 405, Arithmetic Logic Unit 407, Return from Recovery Routine Register 404, and the external data and status registers. Since Return from Recovery Routine Register 404 has not been strobed, the address of the microinstruction that was executing during microcycle MC2 remains in Return from Recovery Routine Register 404. This address is retained because the microinstruction must be re-executed when the error recovery routine completes.

The memory error signal on lead MER forces a system branch to the error recovery microroutine as explained next:
1. The MER signal disables the microinstruction register branch address output (lead MBA) from microinstruction register 405 to sequencer 402. The recovery routine address is transmitted from recovery routine address register 409 on lead RRA to sequencer 402 via the SBI bus.
2. The MER signal forces the FS output of function multiplexer 406 to output a function code directing sequencer 402 to perform an immediate branch to the Recovery routine using the address stored in recovery Routine Address Register 409 via the SBI bus.
3. The recovery microroutine activates lead SPMC (refer to FIG. 3) to enable series read gate 305. The latched data from the output bus of error correction circuit 302 is enabled to the data input of processor 301 via the Input Data Bus (IDB).
4. When the corrected data have been input, the firmware executes a diagnostic to determine if the error was a permanent error. If no permanent error condition is detected, the system returns to the original parallel error correction mode by processor 301 removing the connection control signal from lead SPMC.

As part of this return to the original configuration, the last microinstruction in the recovery microroutine is an unconditional branch to the address contained in Return from Recovery Routine Register 404, which address represents the aborted microinstruction. A control bit (ERO) in the microinstruction disables the MBA output from microinstruction register 405 and enables the Return from Recovery Routine Address output (lead RRRA) from Return from Recovery Routine Register 404 to the SBI input of sequencer 402. Microinstruction register 405 now contains the aborted microinstruction which is re-executed.

Permanent Error-Series Error Correction Mode

From the previous explanation, it is evident that several microcycles are required in order to correct a memory read data error. When dealing with typical low error rates, these additional overhead microcycles present a negligible performance degradation. However, in the case of a permanent error, these additional microcycles for each read data error correction can significantly degrade system performance. To alleviate this performance degradation in the case of permanent errors, the parallel error correction circuitry is designed to switch to the series error correction mode when a permanent error is detected (refer to Detailed Description of FIG. 3 for additional details).

When the diagnostic routine detects a permanent error, the system activates a conventional alarm circuit to indicate the permanent error condition. The processor has already disabled parallel read gate 304, and enabled series read gate 305 (refer to FIG. 3) and now maintains these gates in this mode by maintaining the connection control signal on lead SPMC. This maintains the error correction circuitry in the series error correction mode. The alarm signal remains active until the source of the permanent error has been corrected. Additionally, as long as the series error connection mode is activated, the diagnostic routine is disabled. The diagnostic routine mentioned above may be any one of a number of well-known evaluations. These include monitoring the frequency of errors to measure system performance.

While a specific embodiment of the invention has been disclosed, variations in structural detail, within the scope of the appended claims, are possible and are contemplated. There is no intention of limitation to what is contained in the abstract or the exact disclosure as herein presented. The above-described arrangements are only illustrative of the application of the principles of the invention. Normally, other arrangements may be devised by those skilled in the art without departing from the spirit and the scope of the invention.

What is claimed is:
1. In a data transmission system having a processor (301) and a data transit medium and where said processor has an input data bus (IDB) and said data transit medium has an output data bus (RDB), an error correction system comprising:
   parallel read gate means (304) connected between said output data bus (RDB) and said input data bus (IDB) and responsive to the receipt of a data word on said output data bus (RDB) from said data transit medium for transmitting said data word from said output data bus (RDB) to said input data bus (IDB) to provide normal processing operations of said processor (301);
   error correction circuit means (302) connected to said output data bus (RDB) and responsive to the receipt of said data word being output by said data transit medium on said output data bus (RDB) for applying an error indication signal when said data word contains an error on an error sense lead (MER) connected to said processor to interrupt the normal processing operation of said processor (301);
   means in said error correction circuit means (302) responsive to said data word containing an error for correcting said data word to apply said corrected data word on an error output bus (EDB); and
   series read gate means (305) interposed between said error correction circuit (302) and said input data bus (IDB) and responsive to said corrected data word on said error output bus (EDB) for transmitting said corrected data word to said input data bus

(IDB) during interrupted normal processing operations.

2. The invention of claim 1 wherein said processor (301) includes:
error recovery means (400) responsive to said error indication signal on said error sense lead (MER) for generating a connection control signal (SPMC) to reject said data word which contains an error.

3. The invention of claim 2 wherein said series read gate means (305)
is responsive to said connection control signal (SPMC) for interconnecting said error output bus (EDB) and said input data bus (IDB).

4. The invention of claim 3 wherein said parallel read gate means (304) is responsive to said connection control signal (SPMC) for disconnecting said input data bus (IDB) from said output data bus (RDB).

5. The invention of claim 2 wherein said processor (301) further includes:
threshold means connected to said error correction circuit means (302) and responsive to a predetermined frequency of occurrence of said error indication signals on said error sense lead (MER) for continuously applying said connection control signal (SPMC) to said series read gate means (305) and said parallel read gate means (304) to interrupt normal processing operations.

6. In a system having a processor (301) connected to an input data bus (IDB) and a memory (303) connected to an output data bus (RDB) and where said processor and said memory are interconnected by address (ABUS) and control (CBUS) busses over which said processor addresses said memory to output from said memory a memory word over said output data bus (RDB), an error correction system comprising:
error correction means (302, 304, 305) connected between and interconnecting said output data bus (RDB) and said input data bus (IDB) and responsive to said memory word containing an error for generating a processor error signal (MER) to interrupt normal processing operations by said processor;
error recovery means (400) in said processor responsive to said processor error signal (MER) for applying a connection control signal (SPMC) to said error correction means (302, 304, 305) to reject the received memory word containing said error;
error correction circuit means (302) in said error correction means (302, 304, 305) responsive to the receipt of said memory word containing said error for correcting said memory word; and
routing means connected to said error connection circuit means and responsive to said connection control signal (SPMC) for applying said corrected memory word to said input data bus (IDB).

7. The invention of claim 6 wherein said routing means further includes:
series gate means (305) connected between said input data bus (IDB) and said error correction circuit means (302) and responsive to said connection control signal (SPMC) for interconnecting said input data bus (IDB) and said error correction circuit means (302) when an error appears in said memory word.

8. The invention of claim 7 wherein said error correction means (302, 304, 305) further includes:
parallel gate means (304) connected between and interconnecting said input data bus (IDB) and said output data bus (RDB) and responsive to said connection control signal (SPMC) for disconnecting said input (IDB) and said output (RDB) data busses for the duration of said connection control signal.

9. A method for correcting errors during data transmission between a data transmission medium and a connected processor characterized by the steps of:
monitoring in bridged fashion each data word transfer between said data transmission medium and said processor for errors in said data word during normal processing operations by said processor;
generating an error indication signal in response to the presence of an error in said data word to activate an error recovery process in said processor;
aborting the normal processing of said data word containing said error in response to said error recovery process to provide a connection control signal;
correcting said data word containing an error to generate a corrected data word;
switching an error correcting circuit in series between said data transmission medium and said processor in response to said connection control signal to apply to said processor said corrected data word during said aborting step; and
re-executing, with said corrected data word, the normal processing operation that was underway when said aborting step took place.

10. The invention of claim 9 wherein said switching step is additionally characterized by the step of:
restoring said error correcting circuit to the bridged connection mode when said corrected data is received.

11. The invention of claim 9 wherein said switching step is additionally characterized by the step of:
evaluating the frequency and type of errors found in said data word;
maintaining said error correcting circuit in the series mode for subsequent data transfers.

* * * * *